(12) United States Patent
Kanazawa et al.

(10) Patent No.: US 11,177,588 B2
(45) Date of Patent: Nov. 16, 2021

(54) HIGH-TEMPERATURE SUPERCONDUCTING WIRE CONNECTION ASSEMBLY

(71) Applicant: RIKEN, Wako (JP)

(72) Inventors: Shintetsu Kanazawa, Muroran (JP); Hideaki Maeda, Wako (JP); Yoshinori Yanagisawa, Wako (JP)

(73) Assignee: RIKEN, Wako (JP)

( * ) Notice: Subject to any disclaimer, the term of this patent is extended or adjusted under 35 U.S.C. 154(b) by 0 days.

(21) Appl. No.: 16/643,303

(22) PCT Filed: Aug. 27, 2018

(86) PCT No.: PCT/JP2018/031617
§ 371 (c)(1),
(2) Date: Feb. 28, 2020

(87) PCT Pub. No.: WO2019/044783
PCT Pub. Date: Mar. 7, 2019

(65) Prior Publication Data
US 2020/0212605 A1 Jul. 2, 2020

(30) Foreign Application Priority Data
Aug. 30, 2017 (JP) .............................. JP2017-165142

(51) Int. Cl.
*H01R 4/68* (2006.01)
*H01R 4/02* (2006.01)
*H01B 12/06* (2006.01)

(52) U.S. Cl.
CPC ............... *H01R 4/68* (2013.01); *H01R 4/021* (2013.01); *H01B 12/06* (2013.01)

(58) Field of Classification Search
CPC ........... H01R 4/68; H01R 4/021; H01B 12/06
See application file for complete search history.

(56) References Cited

U.S. PATENT DOCUMENTS

| 4,751,563 A | 6/1988 | Laibowitz et al. |
| 4,831,421 A | 5/1989 | Gallagher et al. |
(Continued)

FOREIGN PATENT DOCUMENTS

| JP | 61-114585 A | 6/1986 |
| JP | 62-88381 A | 4/1987 |
(Continued)

OTHER PUBLICATIONS

Translation of JP 2011-134610. (Year: 2011).*
(Continued)

*Primary Examiner* — Paul A Wartalowicz
(74) *Attorney, Agent, or Firm* — Birch, Stewart, Kolasch & Birch, LLP

(57) ABSTRACT

In a high-temperature superconducting (HTS) wire connection assembly in which HTS wires each including a HTS layer are connected to each other, a first HTS wire and a second HTS wire that face each other are connected to each other at a plurality of joint portions separated from each other along a longitudinal direction of the first HTS wire and the second HTS wire. Each of the plurality of joint portions may preferably have any one of a rectangle shape, a rounded rectangle shape, and an ellipse shape, and it is preferable to satisfy $0.1 < L/W < 1.5$, and is more preferable to satisfy $0.25 < L/W < 0.75$ when a length in the longitudinal direction of the HTS wire is taken as L and a length in a width direction of the HTS wire is taken as W. It is also preferable that W and/or L monotonously increase from upstream side toward downstream side along the longitudinal direction of the wire.

5 Claims, 6 Drawing Sheets

(56) References Cited

U.S. PATENT DOCUMENTS

| | | | |
|---|---|---|---|
| 2006/0073975 A1* | 4/2006 | Thieme | H01L 39/143 505/125 |
| 2010/0210468 A1 | 8/2010 | Lee et al. | |
| 2012/0021915 A1 | 1/2012 | Kodama et al. | |
| 2017/0011823 A1 | 1/2017 | Jin et al. | |
| 2017/0062097 A1 | 3/2017 | Amano et al. | |
| 2018/0272462 A1 | 9/2018 | Mori | |

FOREIGN PATENT DOCUMENTS

| | | |
|---|---|---|
| JP | 10-300832 A | 11/1998 |
| JP | 2001-257114 A | 9/2001 |
| JP | 2011-515792 A | 5/2011 |
| JP | 2011-134610 A | 7/2011 |
| JP | 2012-28172 A | 2/2012 |
| JP | 2015-219960 A | 12/2015 |
| JP | 2016-91880 A | 5/2016 |
| JP | 2017-117523 A | 6/2017 |
| WO | WO 2015/118732 A1 | 8/2015 |
| WO | WO 2017/043555 A1 | 3/2017 |

OTHER PUBLICATIONS

Machine Translation of JP 2017-117523 (Year: 2017).*
International Search Report, issued in PCT/JP2018/031617, PCT/ISA/210, dated Nov. 20, 2018.
Jin et al., "Development of a superconducting joint between a $GdBa_2Cu_3O_7$-$\delta$-coated conductor and $YBa_2Cu_3O_7$-$\delta$ bulk: towards a superconducting joint between RE (Rare Earth) $Ba_2Cu_3O_7$-$\delta$-coated conductors", Superconductor Science and Technology, vol. 28, (2015) 075010, total 6 pages.
Notice of Reasons for Refusal for Japanese Application No. 2017-165142, dated Apr. 17, 2019.
Written Opinion of the International Searching Authority, issued in PCT/JP2018/031617, PCT/ISA/237, dated Nov. 20, 2018.
International Preliminary Report on Patentability and Written Opinion dated Mar. 3, 2020, in PCT/JP2018/031617 (Forms PCT/IB/373 and PCT/ISA/237).

* cited by examiner

HIGH-TEMPERATURE SUPERCONDUCTING WIRE CONNECTION ASSEMBLY

TECHNICAL FIELD

The present invention relates to a high-temperature superconducting (HTS) wire connection assembly.

BACKGROUND ART

Superconducting wires are widely used in NMR (Nuclear Magnetic Resonance) devices, MRI (Magnetic Resonance Imaging) devices, and the like. In recent years, rare earth-based HTS wires (REBCO superconducting wires) have been produced, and research and development using these are being conducted.

The connection between superconducting wires is a technical issue that is necessary to be overcome for providing a very long wire and realizing a persistent current mode. A conventional low resistance connection between REBCO superconducting wires is performed by soldering. It has been known that, with this method, an electric resistance of about $10^{-8} \Omega$ may generate.

In recent years, a direct connection between REBCO superconducting wires has been studied, such as a technique called a melting diffusion method proposed in PTL 1. In this method, the protective layer of two REBCO superconducting wires is removed, and the superconducting layers are heated to their melting point while being pressed to bring them into contact with each other, so that a part of the contacted superconducting layers in the thickness direction is subjected to melt diffusion to join the superconducting wires. It has been reported that such a method makes it possible to connect the REBCO superconducting wires to each other with a lower resistance than in the connection obtained by soldering. A similar method is proposed also in PTL 2 and 3.

In addition, the present inventors have proposed, in PTL 4 and NPL 1, a method of indirectly connecting HTS wires via a HTS bulk body (melt growth method). This method is a technique that connects a HTS layer and a HTS bulk body by melting the HTS bulk body and performing crystal growth using the HTS layer serving as a seed crystal. This method has an advantage of performing the connection in a shorter time and also providing a connection with higher mechanical strength than in the case of the melting diffusion method.

CITATION LIST

Patent Literature

[PTL 1] Japanese Translation of PCT Application No. 2011-515792
[PTL 2] Japanese Patent Application Publication No. 2015-219960
[PTL 3] Japanese Patent Application Publication No. 2016-91880
[PTL 4] WO 2015/118732

Non Patent Literature

[NPL 1] Jin, Xinzhe, et al., "Development of a superconducting joint between a $GdBa_2Cu_3O_{7-\delta}$-coated conductor and $YBa_2Cu_3O_{7-\delta}$ bulk: towards a superconducting joint between RE (Rare Earth) $Ba_2Cu_3O_{7-\delta}$-coated conductors", Superconductor Science and Technology 28.7 (2015): 075010.

SUMMARY OF INVENTION

Technical Problem

In any of the connection methods described above, the greatest technical issue is to increase the current capacity of the superconducting connection. Joining methods using a bulk have not so much current capacity so far. Further, in the melting diffusion method, a long heat treatment for one week or longer is required to increase the current capacity.

In view of such issues, an object of the present invention is to provide a technique capable of manufacturing a connection with a large current capacity in the connection of HTS wires.

Solution to Problem

In order to solve the above-described issues, according to the present invention, when connecting high-temperature superconducting (HTS) wires, the wires are connected at a plurality of joint portions separated from each other. More specifically, the present invention is a HTS wire connection assembly in which HTS wires each including a HTS layer are connected to each other, wherein a first HTS wire and a second HTS wire that face each other are connected to each other at a plurality of joint portions separated from each other along a longitudinal direction of the first HTS wire and the second HTS wire.

In the present invention, each of the plurality of joint portions may have any one of a rectangle shape, a rounded rectangle shape, and an ellipse shape, and it is preferable that, when a length in the longitudinal direction of the HTS wire is taken as L and a length in a width direction of the HTS wire is taken as W, $0.1 < L/W < 1.5$ is satisfied. Further, it is more desirable that $0.25 < L/W < 0.75$ is satisfied.

In the present invention, it is preferable that W and/or L for the plurality of joint portions monotonously increase from upstream side toward downstream side along the longitudinal direction of the HTS wire.

Advantageous Effects of Invention

According to the present invention, it is possible to provide a connection of HTS wires with a large current capacity.

DESCRIPTION OF EMBODIMENTS

Hereinafter, embodiments of the present invention to be provided will be described with reference to the drawings.

First Embodiment

<Overview>

Figure 1A:
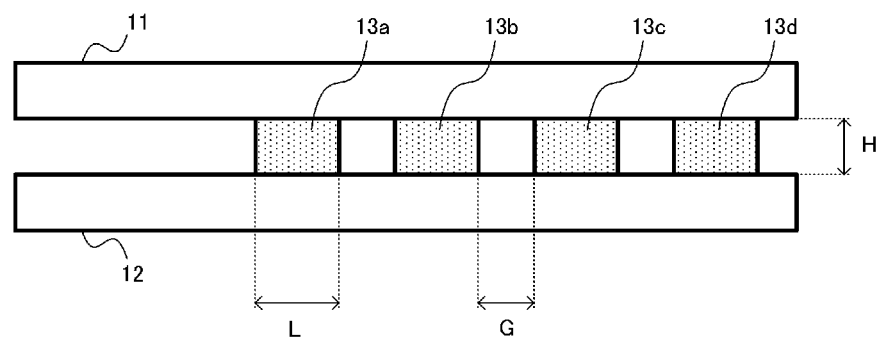
FIGS. 1(A) to 1(C) are diagrams illustrating an outline of a superconducting wire connection assembly according to an embodiment.
Figure 1B:
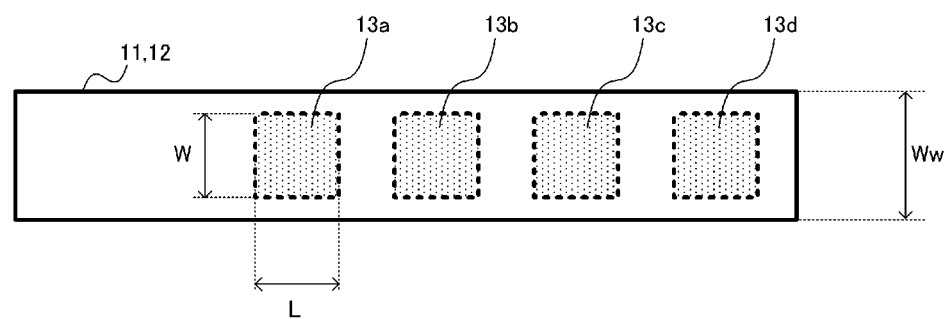
Figure 1C:
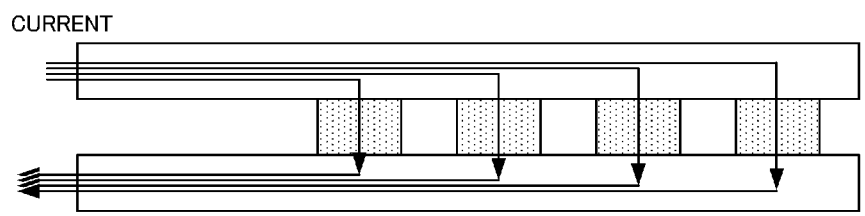

FIG. 1(A) is a side view of a high-temperature superconducting (HTS) wire connection assembly, and FIG. 1(B) is a top view of the HTS wire connection assembly. FIG. 1(C) is a schematic diagram illustrating a flow of current in the HTS wire.

The HTS wire connection assembly according to the present embodiment is obtained by connecting two HTS wires 11 and 12 via a plurality of HTS bulk bodies 13a, 13b, 13c, and 13d. It is to be noted that, in the following, for simplicity of description, the HTS wire may be referred to as the wire, and the HTS bulk body may be referred to as the bulk body. Further, the bulk bodies 13a, 13b, 13c, and 13d may be collectively referred to as the bulk body 13.

The wires 11 and 12 are, for example, REBCO wires, and the bulk body 13 is a REBCO bulk body having a lower melting point than the wires 11 and 12.

In the melt growth method, a REBCO layer is exposed from a REBCO wire, the bulk 13 is placed between the wires, and is then subjected to a heat treatment to form a joint. Specific joining methods are described in NPL 1 and PTL 4.

As illustrated in the figure, a plurality of joints formed by the bulk bodies 13 are arranged in parallel. In FIGS. 1(A) and 1(B), there are four joints, but any number of joints may be used as long as it is two or more. An upper limit is present for the maximum current to flow in each of the joint portions. However, arranging the joints in parallel makes it possible to increase the current flowing through the whole connection assembly. For example, superconducting wires for NMR or MRI applications require a junction current of about 100 amperes (77 K and no magnetic field). In the case of joining via a bulk, it is believed that the maximum current to flow in a single joint is about 10 amperes (77 K and no magnetic field). In the present method, it is possible to increase the current capacity to 100 amperes by setting the number of joints to ten.

The case where the wires 11 and 12 are connected via the bulk bodies 13 by the melt growth method has been described above as an example. However, the wires 11 and 12 may be directly connected by the melt diffusion method or a solid phase diffusion method. Based on the same principle as described above, it is possible to greatly increase the current capacity at which the current can flow through the whole connection assembly.

It is to be noted that, in general, when a connection part is exposed to a magnetic field, its current capacity is reduced to a fraction of that in the case of no magnetic field. On the other hand, when the temperature is changed from 77 K to 4.2 K, the current capacity increases about 8 times. In that sense, in order to obtain a current capacity of 200 amperes under an operating temperature of 4.2 K and a magnetic field in equipment, it is necessary to allow current flow of about 100 amperes at a temperature of 77 K and no magnetic field in consideration of such an amount of reduction. It is almost impossible to obtain such a large current capacity in a short time at a single joint. However, according to the present method, it is possible to obtain such a large current capacity by forming a plurality of joints in parallel.

<Connection Method>

As described above, the two HTS wires 11 and 12 are connected to each other via the bulk bodies 13. Here, the HTS wires 11 and 12 are REBCO wires, and the bulk body 13 is a REBCO bulk body having a lower melting point than the wires 11 and 12.

The wires 11 and 12 are generally composite wires including a stabilization layer, a substrate, and the like in addition to a REBCO layer (high temperature superconducting layer). The REBCO layer is a rare earth-based superconducting material ($REBa_2Cu_3O_{7-\delta}$) formed into a tape shape (layer shape). The rare earth elements include Sc, Y, La, Ce, Pr, Nd, Pm, Sm, Eu, Gd, Tb, Dy, Ho, Er, Tm, Yb, and Lu. The wire 11 and the wire 12 may each be made of the same rare earth-based superconducting material or a different rare earth-based superconducting material. In the melt growth method, since the bulk body 13 is subjected to crystal growth, the melting point of the REBCO layer is required to be higher than the melting point of the bulk body 13. As REBCO wires, those having a REBCO layer using Gd, Y, or both Gd and Y are generally available. In particular, Gd is a preferable material because it has a relatively high melting point of about 1050° C. to 1100° C. It is to be noted that the REBCO layer of the wire 11 and the REBCO layer of the wire 12 may be made of different rare earth superconductive materials.

Figure 2:
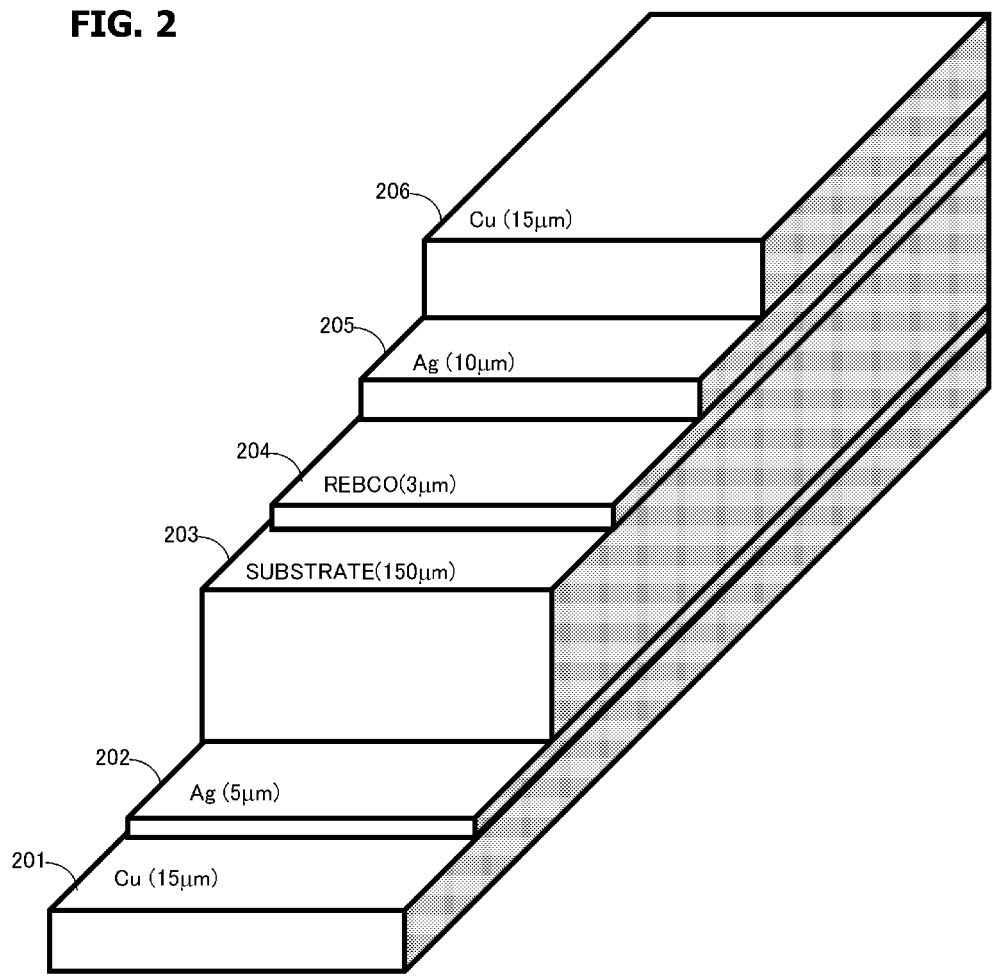
FIG. 2 is a diagram illustrating a structure of a general HTS wire.

A commercially available REBCO wire has a multilayer structure composed of a plurality of materials for mechanical reinforcement and electrical protection. FIG. 2 illustrates an example of the structure of the REBCO wire. As illustrated in the figure, the REBCO wire includes, from the lower layer side, a copper stabilization layer 201 (15 μm), a silver stabilization layer 202 (5 μm), a substrate 203 (150 μm), an intermediate layer (not illustrated, up to 0.2 μm), a REBCO layer 204 (3 μm), a silver stabilization layer 205 (10 μm), and a copper stabilization layer 206 (15 μm). The REBCO layer of the REBCO wire corresponds to the high temperature superconducting layer according to the present invention.

In order to join the wires 11 and 12 to the bulk bodies 13, it is necessary to bring the REBCO layer 204 into contact with the bulk bodies 13. Accordingly, it is necessary to perform a pretreatment for peeling the copper stabilization layers and the silver stabilization layers (and also the substrate as required) to expose the REBCO layer 204. In addition, since high-temperature firing is performed in the joining process, it is necessary to remove materials having a melting point equal to or lower than the firing temperature. The firing temperature, which is determined according to the melting point of the bulk body 13, is 700° C. or higher. Accordingly, it is necessary to remove solder, if used for the wire. Further, if the firing temperature exceeds 900° C., it is desirable to remove silver or a silver alloy (having a melting point of around 900° C.). The method for removing these materials will be described in detail later.

The bulk body 13 is made of a rare earth-based superconducting material ($RE'Ba_2Cu_3O_{7-\delta}$), like the superconducting layers of the wires 11 and 12, but is not a wire but a bulk body. Here, RE' is one or more rare earth elements (Sc, Y, La, Ce, Pr, Nd, Pm, Sm, Eu, Gd, Tb, Dy, Ho, Er, Tm, Yb, Lu) that are different elements or compositions from RE in the REBCO layer of the REBCO wire 10. The melting point of the bulk body 13 needs to be lower than the melting point of the REBCO layers of the wires 11 and 12 at least in the firing process. Further, since the firing temperature can be set to be lower as the melting point of the bulk body 13 is lower, it is desirable that the melting point of the bulk body 13 is lower. Therefore, it is preferable that the rare earth element in the bulk body 13 is mainly composed of Y, Yb, Er, Ho or the like, which has a low melting point.

Further, the smaller the amount of oxygen in the chemical formula $REBa_2Cu_3O_{7-\delta}$ of REBCO, the lower the melting point. Therefore, in order to produce a connection assembly at a lower temperature, it is preferable to prepare a bulk body having as little oxygen as possible within a range where the original crystal structure can be maintained. Specifically, the amount of oxygen in the bulk body 20 before the firing process is preferably in a range of −1 to 4 of $\delta$, and more preferably in a range of 0.5 to 2 of $\delta$.

Further, in the finally produced connection assembly, since the critical current at the joining interface between the bulk bodies 13 and the wires 11 and 12 depends on the amount of oxygen, it is preferable to perform a heat treatment for supplying oxygen after the joining to increase the amount of oxygen, thereby enhancing the superconducting performance.

Of the surfaces of the bulk bodies 13, at least surfaces in contact with the REBCO layers of the wires 11 and 12 are crystallized by crystal growth. It is not necessary for the whole bulk bodies to be subjected to crystal growth to turn each bulk body to a complete single crystal, and the surface parts other than the contact surfaces, as long as each contact surface is just a single crystal, may be polycrystalline. The thickness of their single crystal layer may be an amount to be able to provide sufficient joint strength. For example, a thickness of several hundred nm (100 to 500 nm) or more can provide sufficient joint strength, so that the firing time for obtaining crystal growth of about 1 μm in YbBCO is about 1 hour.

The critical current of the bulk body 13 is related to the kind, purity, and shape of the rare earth element contained therein. The rare earth element contained in the bulk body 13 may be of any kind. The purity of the bulk body 13 is 10% or higher, preferably 50% or higher, and more preferably 70% or higher. Although it is not difficult to produce a polycrystalline bulk body having a purity of 70% or higher, a commercially available single crystal bulk body may often be made from a non-superconducting material (normal conductor or insulator) in order to maintain its shape during heating production. Since the electrical conductivity varies depending on the purity of the bulk body, the purity of the bulk body may be 10% or higher, but is preferably 50% or higher as much as possible.

Adjusting the thickness of the bulk body 13 (height H in FIG. 1(A)) makes it possible to increase the critical current and the mechanical strength. In order to spread the bulk melted at the time of high-temperature joining over the superconducting layer of the wire and obtain a sufficient joining interface, it is desirable for the bulk body to have a thickness larger than the thickness of the superconducting layer of the wire 3 μm. Therefore, the bulk 13 needs to have a thickness of 1 μm or more. However, considering the production of a single bulk and the setting before the joining process, a bulk of 20 μm or more is convenient to handle. The upper limit of the thickness, which is determined depending on the method of producing the bulk and the ease of use of the connection assembly, may be 10 mm or less. Therefore, the height H may be appropriately selected within a range of from 0.001 mm to 10 mm. Although the heights H of the plurality of bulk bodies 13 may be the same or different, it is preferable that the heights H are the same for all the bulk bodies 13 in view of ease of production.

The shape of the bulk body 13 is preferably a symmetric shape, and may be a rectangle, a rounded rectangle, or an ellipse. In the following, as illustrated in FIG. 1(B), the length of the bulk body 13 in the longitudinal direction of the wire is referred to as L, and the length in the width direction is referred to as W. The length L and width W will be described later.

A gap G between the adjacent bulk bodies 13 may be any gap as long as it does not cause the bulk bodies 13 to merge during the heat treatment, and may be, for example, 1 to 100 mm. It is to be noted that the smaller the gap G, the shorter the overall length of the connection part, which is preferable. For example, the gap G may be 10 mm.

The flow of a process of connecting the REBCO wires will be described. It is to be noted that the melt growth method is described in NPL 1 and PTL 4, and accordingly, only a brief description will be given herein.

First, the REBCO bulk body 13 is prepared. The bulk body 13 may be produced on the spot, but may be a commercially available product. The methods of producing include a sintering method and an organic acid salt method, and the latter can produce a high-purity one. Further, it is preferable to perform a heat treatment (rapid cooling) for introducing oxygen vacancies in order to lower the melting point of the bulk body 13 as necessary.

Further, the REBCO wires 11 and 12 are prepared. Since the REBCO wire 10 has a multilayer structure, it is necessary to remove the protective layers so that the REBCO layer is exposed. As methods of exposing the REBCO layer, there are known two methods: a method of exposing the REBCO layer 204 in the state where the REBCO layer 204 remains on the substrate 203 side, and a method of removing the substrate 203. In any of the methods, an end of the REBCO wire is put in liquid nitrogen and rapidly cooled to a very low temperature (77 K) and then removed, and after that, when a force is applied to the end of the REBCO wire, the respective materials can be properly separated due to imperfectly constrained thermal stress between the materials. It is to be noted that either surface of the REBCO layer 204 can be exposed depending on the stress direction.

Then, the wires 11 and 12 and the bulk bodies 13 are set and placed in a heating furnace so that the REBCO surfaces of the two exposed wires 11 and 12 sandwich the bulk bodies 13, and are heated to a temperature that is equal to or higher than the melting point of the bulk bodies 13 and lower than the melting point of the wires 11 and 12. As a result, the bulk body 13 will be in a liquid phase state. Thereafter, by slow cooling, the surfaces of the bulk bodies 13 that come into contact with the wires 11 and 12 are crystal-grown in which the REBCO of the wires 11 and 12 serves as a seed crystal. Finally, in order to restore the superconducting performance, a heat treatment is performed to add oxygen into the REBCO material.

It is to be noted that some or all of the bulk bodies 13 may be heated at the same time and joined at the same time, or each bulk body 13 may be subjected to the heat treatment independently. However, when some or all of the bulk bodies 13 are heated at the same time with a single temperature controller, there may be variations in temperature in each bulk body 13. Therefore, it is desirable to join the bulk bodies 13 at the same time while controlling their temperature independently with a plurality of temperature controllers or to heat each bulk body 13 separately.

<Experiment 1: Single Joint>

First, only one joint (bulk body 13) was provided, and then its critical current was measured.

In this experiment, REBCO wires under development by Sumitomo Electric Industries, Ltd. were prepared as the REBCO wires 11 and 12. These wires each have the structure illustrated in FIG. 2 and have a width of 4 mm (Ww=4 mm) and a thickness of about 0.2 mm. The REBCO layer of each wire mainly contains Gd as a rare earth element and also contains Y, and its melting point is about 1000° C. to 1100° C. (in the atmosphere). Further, as the bulk body 13, a bulk body of Yb123 mainly containing Yb as a rare earth element was used. The melting point of the Yb123 bulk is about 930° C. (in the atmosphere).

An experiment was performed in which the width W of the bulk body 13 was fixed to 4 mm, which is the same as the wire width Ww, and the length L of the bulk body 13 was changed. Then, the critical current $I_c$ of the whole connection and the critical current $I_{c\text{-}max}$ of the wire alone were measured. The critical current $I_{c\text{-}max}$ of the wire alone reflects the deterioration of the wire due to the joining. When the bulk body width W is equal to the wire width Ww, the critical current $I_{c\text{-}max}$ becomes the upper limit of the increasable critical current of the whole connection by increasing the number of joints.

Experiments were conducted for the respective bulk body lengths L=0.5 mm, 1 mm, 2 mm, 3 mm, 4 mm, 5 mm, 12 mm, 16 mm and 20 mm. For each of the lengths, the height H of the bulk body was fixed at 0.05 mm. Heating was performed under the condition of holding for 1 minute at a target temperature of 930° C. The experimental results are shown in a graph of FIG. 3.

The critical current $I_c$ of the whole connection is indicated by a black circle and a dotted line, and the critical current $I_{c\text{-}max}$ of the wire alone is indicated by a white circle and a solid line. The critical currents were measured by measuring the voltage while increasing the amount of current in liquid nitrogen (77 K).

Figure 3:
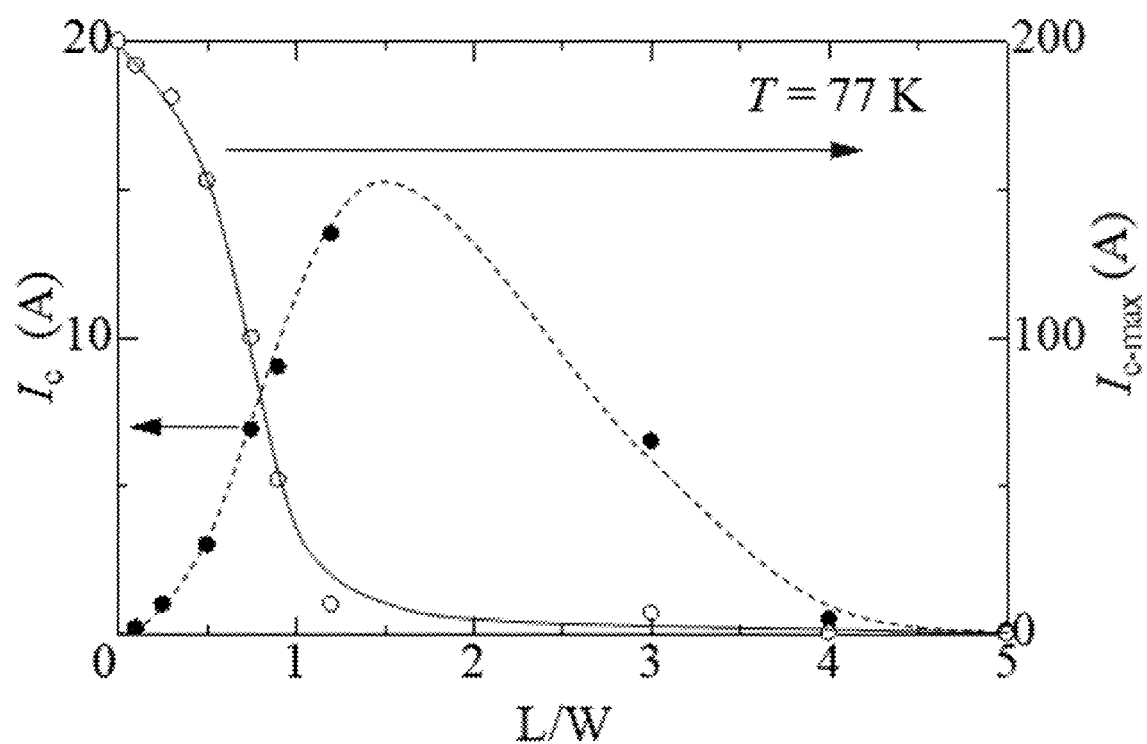
FIG. 3 is a graph showing a relationship between the ratio of length L and width W of the connection assembly and each of junction surface current capacity $I_c$ and current capacity $I_{c-max}$ of the wire alone.

As can be seen from FIG. 3, the critical current $I_c$ of the whole connection increases up to about L/W=1. On the other hand, the critical current $I_{c\text{-}max}$ of the wire alone rapidly decreases from around L/W=1, and is about the same as $I_c$ at about L/W=1.5 or more.

Since the critical current at the joint surface is proportional to the joint area, it is expected that when W is fixed, the critical current $I_c$ increases as L increases. However, as described above, the critical current $I_{c\text{-}max}$ of the wire alone is the upper limit of the critical current of the whole joint (under the condition of W=Ww). That is, it can be seen that $I_{c\text{-}max}$ is the upper limit of $I_c$ when L/W=1.5 or more.

The critical current $I_{c\text{-}max}$ of the wire is reduced from the critical current before the heat treatment because of the deterioration due to the heat treatment. It is considered that the reasons for the reduction include performance degradation due to diffusion of the metal material (Ni, Fe, etc.) of the wire substrate over the superconducting layer, cracking of the superconducting ceramic layer (REBCO layer) due to high-temperature firing, and the like. The reason why the larger the L/W is, the larger the deterioration is that the temperature gradient becomes larger (the thermal conductivity of the REBCO material is low).

<Experiment 2: A Plurality of Joints>

Figure 4:
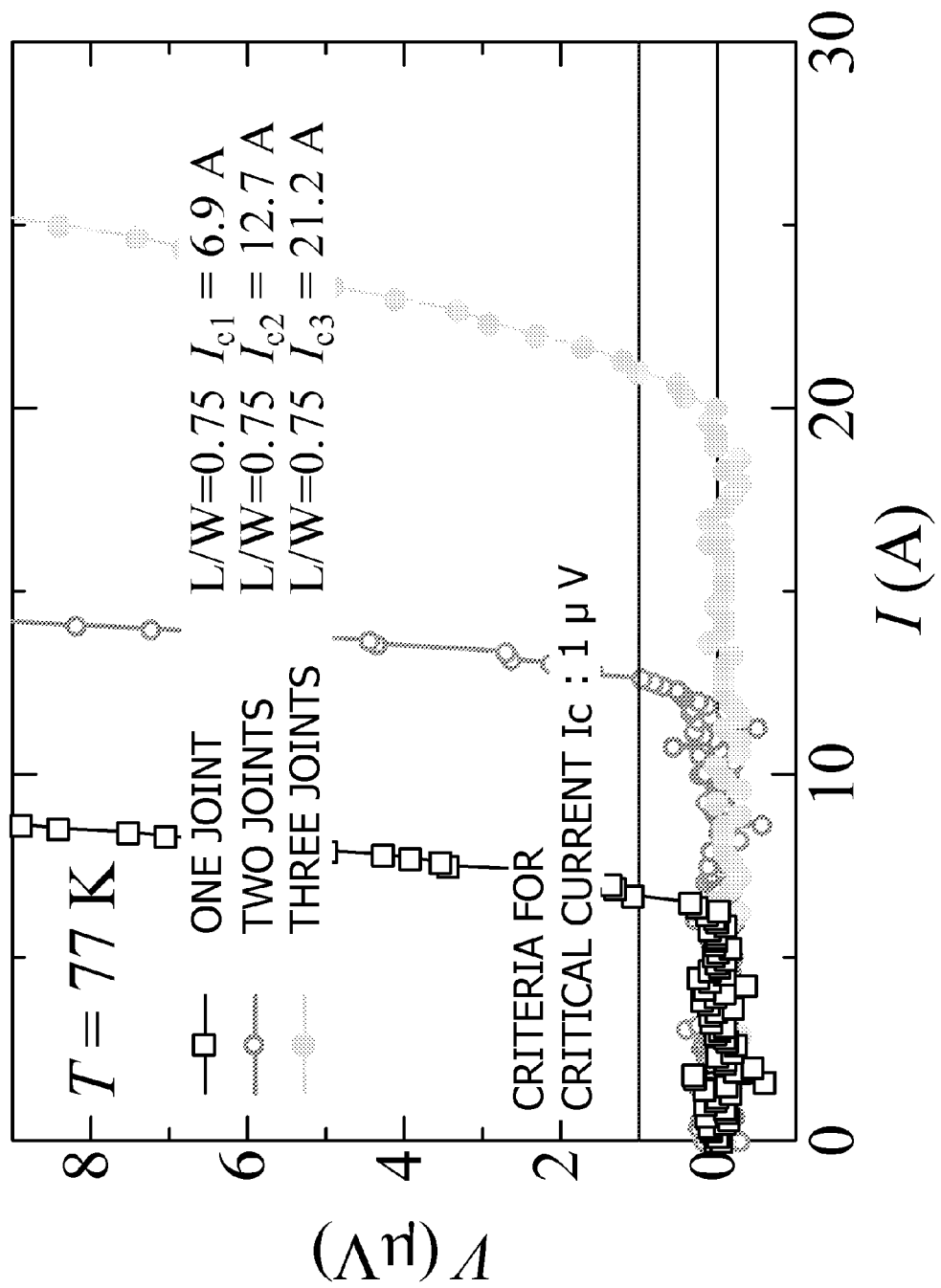
FIG. 4 is a graph showing measurement results of electrical resistances for one to three joint portions.

Next, the critical current of the whole joint was measured for each of one joint, two joints, and three joints. FIG. 4 shows the experimental results. The conditions of this experiment were W=4 mm and L=3 mm (L/W=0.75), and the other conditions were the same as those in Experiment 1. The gap G for a plurality of joints arranged was 10 mm.

In each case of one joint portion, two joint portions, and three joint portions, the critical currents were $I_{c1}$=6.9 A, $I_{c2}$=12.7 A, and $I_{c3}$=21.2 A. It was found that the critical current was proportional to the number of joint portions.

As described above, according to the present embodiment, it can be seen that increasing the number of joints makes it possible to increase the critical current of the whole connection assembly. Here, when the width W of the bulk body is set to the wire width Ww (W=Ww), it is necessary to determine the bulk body length L in consideration of a reduction in the critical current $I_{c\text{-}max}$ of the wire itself because of the deterioration due to the heat treatment. If L/W≤1.5, preferably L/W≤1, more preferably L/W≤0.75, a sufficiently large critical current can be obtained. Further, when L/W is made small, in order to obtain the same critical current, the number of joint portions must be increased, and thus the whole connection part becomes long. Therefore, L/W is preferably larger than 0.1, and more preferably larger than 0.25.

Further, the melt growth method can perform the joining in a shorter time than the other methods. Therefore, according to the present embodiment, it is possible to produce a connection assembly with a large current capacity in a short time.

Second Embodiment

In the first embodiment, the case where the bulk body width W is the same as the wire width Ww has been described. In the present embodiment, the case where the bulk body width W is made smaller than the wire width Ww (W<Ww) will be considered.

First, the amount of current that can flow through the joint portion is proportional to the joint area. Therefore, the amount of current per one joint portion varies depending on the magnitude of W even if L/W is constant.

Figure 5:
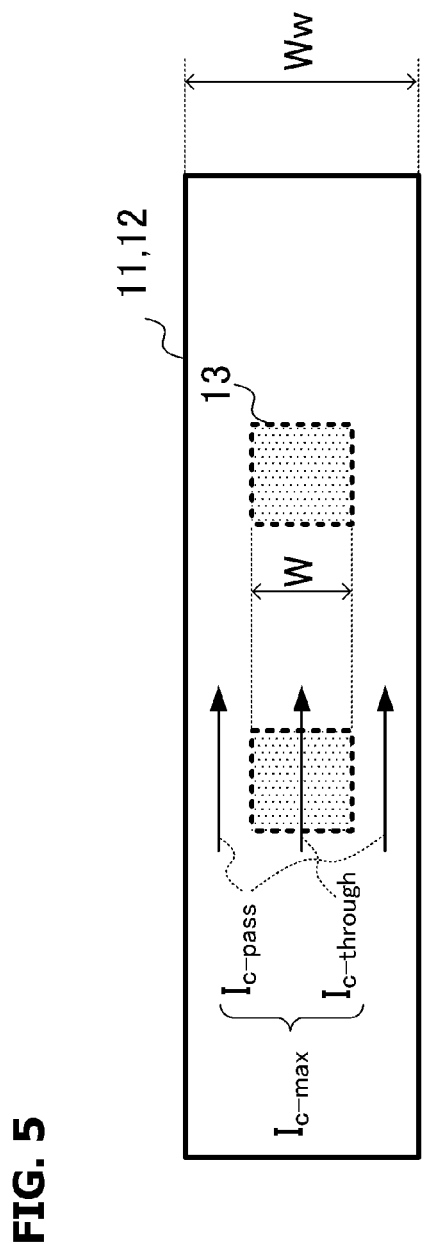
FIG. 5 is a diagram illustrating a current that flows through a wire when width W of the joint portion is smaller than wire width Ww.

On the other hand, the deterioration of the wire depends on L/W, as is apparent from the above-described causes. However, in the case of W<Ww, as illustrated in FIG. 5, the current paths in the wire include a current path that passes through the joint portion and a current path that passes through portions other than the joint portion. The critical current $I_{c\text{-}max}'$ of the wire alone is the sum of the critical current $I_{c\text{-}through}$ through the joint surface current path and the critical current $I_{c\text{-}pass}$ through the current path that bypasses the joint surface ($I_{c\text{-}max}' = I_{c\text{-}through} + I_{c\text{-}pass}$).

It is to be noted that when the critical current of the wire before the heat treatment is $I_{c\text{-}ow}$, it can be expressed as $I_{c\text{-}pass} = I_{c\text{-}ow} \times (Ww-W)/Ww$. Similarly, if the critical current of the wire alone when the width of the joint portion (bulk body width W) is the same as that of the wire is $I_{c\text{-}max}$ (see FIG. 3), it can be expressed as $I_{c\text{-}through} = I_{c\text{-}max} \times W/Ww$.

For example, Ww=4 mm, W=2 mm, L=1.5 mm (L/W=0.75), $I_{c\text{-}ow}$=200 A, and $I_{c\text{-}max}$=100 A. Accordingly, $I_{c\text{-}max}'$ is 150 A (=100×0.5+200×0.5). That is, by making the width W smaller than the wire width Ww, it is possible to increase the critical current of the wire alone at the joint portion.

When the width W and the length L of the bulk body (joint portion) are determined, then a current capacity per one joint portion is obtained. Therefore, by simple calculation, it is possible to obtain the number of joint portions for obtaining a current capacity necessary for the whole connection assembly.

According to the present embodiment, making the width W of the bulk body smaller than the wire width Ww makes it possible to provide a connection assembly having a larger current capacity than that of the first embodiment.

Third Embodiment

The second embodiment can increase the current capacity as compared with the first embodiment, but has a disadvantage that the number of joints is increased and the length of the whole connection part is increased. Therefore, in the present embodiment, a connection method is adopted in which the number of joint portions is reduced to shorten the length of the connection part without reducing the current capacity.

In the present embodiment, the width W of the bulk body is gradually increased from the upstream side toward the downstream side. It is to be noted that "gradually increased" means a monotonic increase in a broad sense, and adjacent bulk bodies may have the same width. In the present embodiment, as illustrated in FIGS. 1(A) to 1(C), two wires are connected to each other so that current flows back. When the end far from the current supply source is referred to as a distal end, the side close to the distal end is downstream, and the side far from the distal end is upstream. In the present embodiment, the bulk body 13a is located on the most upstream side, and the bulk body 13d is located on the most downstream side. Accordingly, the width W of the bulk body 13a is the smallest and the width W of the bulk body 13d is the largest.

The amount of current flowing through the wire becomes smaller toward the downstream side. Therefore, the critical current of the wire alone can be made smaller on the downstream side than on the upstream side, and thus an increased joint surface area can result in an increased current capacity at the joint surface. The increased joint surface current capacity can result in a reduced number of joints required.

Figure 6:
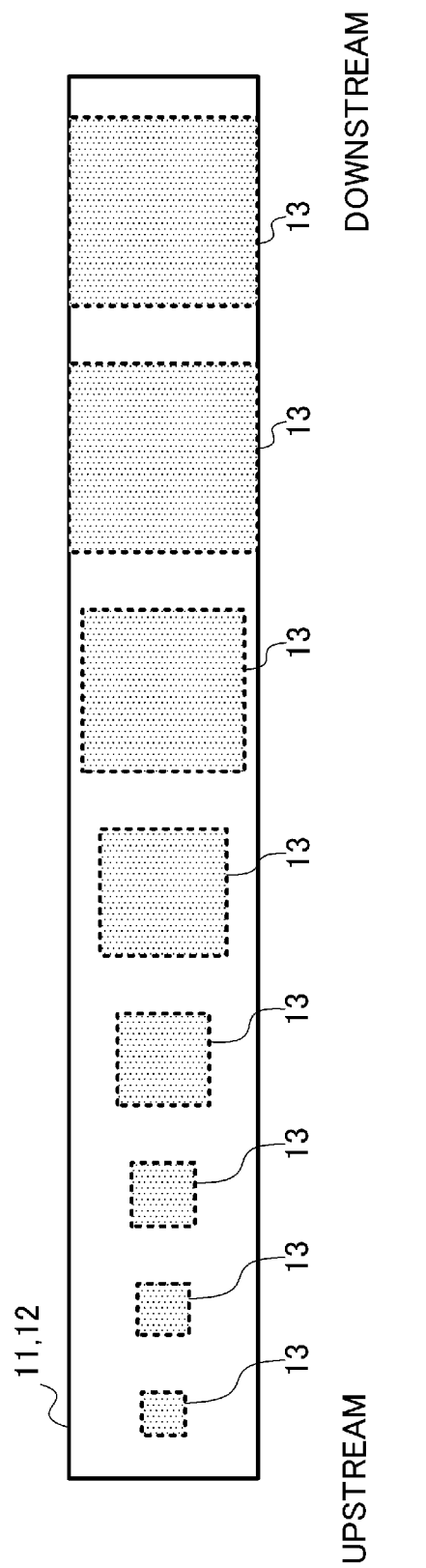
FIG. 6 is a diagram illustrating an outline of a connection assembly according to a third embodiment.

FIG. 6 illustrates an example of the connection assembly according to the present embodiment. Here, W and L are increased toward the downstream side while L/W=1 is kept constant. Here, the number of joints is eight.

The respective specific sizes of the plurality of joints are not limited to those illustrated in FIG. 6, and their sizes may be determined as appropriate. For example, W (and L) may be gradually increased toward the downstream side while L/W is kept constant. Alternatively, L may be gradually increased toward the downstream side while W is kept constant. Alternatively, W may be gradually increased toward the downstream side while L is kept constant. Alternatively, W and L may be gradually increased toward the downstream side with keeping L/W within a predetermined range (the value of L/W may be increased or decreased). That is, it is only necessary to determine at least one of W and L for the plurality of joints so as to monotonously increase from the upstream side toward the downstream side. It is to be noted that when W is gradually increased, W is made constant as W=Ww after W reaches the wire width Ww.

According to the present embodiment, it is possible to increase the critical current in the whole joint, and also to shorten the length of the whole joint.

Other Embodiments

In the embodiments described above, the two wires are connected to each other via the bulk body. However, the two wires may be directly connected in contact with each other without using the bulk body. Examples of a method for directly connecting the wires include the melt diffusion method and the solid phase diffusion method.

INDUSTRIAL APPLICABILITY

The present invention can increase the critical current in a HTS wire connection assembly. The present invention can be used to fabricate HTS wires that are long enough to be used in the development of any superconducting magnet (superconducting coil), and can be applied to, in particular, application equipment that needs to be operated in the persistent current mode, such as MRI or NMR equipment.

REFERENCE SIGNS LIST 11, 12 REBCO wire (high-temperature superconducting wire)
13 REBCO bulk body (high-temperature superconducting bulk body)

The invention claimed is:

1. A high-temperature superconducting (HTS) wire connection assembly in which HTS wires are connected to each other, wherein:
   each HTS wire includes a HTS layer consisting of a high-temperature superconducting material;
   a first HTS wire and a second HTS wire that face each other along the longitudinal direction are superconductively connected to each other at a plurality of joint portions separated from each other along a longitudinal direction of the first HTS wire and the second HTS wire,
   the HTS layer of the first HTS wire and the HTS layer of the second HTS wire are joined,
   wherein each of the plurality of joint portions has any one of a rectangle shape, a rounded rectangle shape, and an ellipse shape, and
   wherein, when a length in the longitudinal direction of the HTS wire in the joint portions is taken as L and a length in a width direction of the HTS wire in the joint portions is taken as W, W and/or L for the plurality of joint portions monotonously increase from an upstream side toward a downstream side along the longitudinal direction of the HTS wire.

2. The HTS wire connection assembly according to claim 1, wherein $0.1 < L/W < 1.5$ is satisfied.

3. The HTS wire connection assembly according to claim 2, wherein $0.25 < L/W < 0.75$ is satisfied.

4. The HTS wire connection assembly according to claim 1, wherein the HTS layer of the first HTS wire and the HTS layer of the second HTS wire are joined via a high-temperature superconductor.

5. The HTS wire connection assembly according to claim 1, wherein the HTS layer of the first HTS wire and the HTS layer of the second HTS wire are joined directly.

* * * * *